(12) United States Patent
Jeong

(10) Patent No.: US 10,598,445 B2
(45) Date of Patent: Mar. 24, 2020

(54) GRAPHITE COMPONENT AND MANUFACTURING METHOD THEREOF

(71) Applicant: Hyundai Motor Company, Seoul (KR)

(72) Inventor: Sung Cheul Jeong, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 500 days.

(21) Appl. No.: 15/360,253

(22) Filed: Nov. 23, 2016

(65) Prior Publication Data

US 2018/0031336 A1 Feb. 1, 2018

(30) Foreign Application Priority Data

Jul. 26, 2016 (KR) .................. 10-2016-0094988

(51) Int. Cl.
| | |
|---|---|
| *F28F 21/02* | (2006.01) |
| *H01L 23/367* | (2006.01) |
| *H01L 23/373* | (2006.01) |
| *C01B 32/20* | (2017.01) |
| *H05K 7/20* | (2006.01) |
| *C09D 5/24* | (2006.01) |
| *C09D 179/08* | (2006.01) |
| *H05K 1/02* | (2006.01) |

(52) U.S. Cl.
CPC .............. *F28F 21/02* (2013.01); *C01B 32/20* (2017.08); *C09D 5/24* (2013.01); *C09D 179/08* (2013.01); *H01L 23/367* (2013.01); *H01L 23/373* (2013.01); *H05K 1/0209* (2013.01); *H05K 7/20481* (2013.01); *C01P 2006/40* (2013.01)

(58) Field of Classification Search
CPC ... C23C 8/44; C23C 8/46; F28F 21/02; C09D 5/24; C09D 179/08; H05K 1/0209; H05K 7/20481; C01P 2006/40; C01B 32/20
See application file for complete search history.

(56) References Cited

U.S. PATENT DOCUMENTS 4,830,819 A * 5/1989 Sakuramoto ............ C08L 79/08
156/331.1
2014/0124176 A1 5/2014 Zhamu et al.

FOREIGN PATENT DOCUMENTS

| | | |
|---|---|---|
| CN | 1116400 A | 2/1996 |
| CN | 101911827 A | 12/2010 |
| CN | 103043657 A | 4/2013 |
| CN | 203032018 U | 7/2013 |
| CN | 103937239 A | 7/2014 |
| CN | 104900611 A | 9/2015 |
| CN | 105142380 A | 12/2015 |
| EP | 0 691 803 A1 | 1/1996 |
| JP | 2009-099878 A | 5/2009 |
| JP | 2014-183261 A | 9/2014 |
| JP | 2014-192401 A | 10/2014 |
| KR | 10-2012-0092364 A | 8/2012 |
| KR | 2015-0104510 A | 9/2015 |
| WO | 2010/008216 A2 | 1/2010 |

* cited by examiner

*Primary Examiner* — Jessee R Roe

(74) *Attorney, Agent, or Firm* — Mintz Levin Cohn Ferris Glovsky and Popeo, P.C.; Peter F. Corless

(57) ABSTRACT

Disclosed is a graphite component comprising a metal substrate; and a graphite layer formed on the metal substrate. The metal substrate has one or more straight portions and one or more bent portions, which preferably forms a zigzag shape, each bent portion has a round shape, and a number of bent portions is two or greater. The graphite component may improve a heat radiation effect, such that lifespan characteristic and performance of an electronic device may be further improved.

19 Claims, 4 Drawing Sheets

GRAPHITE COMPONENT AND MANUFACTURING METHOD THEREOF

CROSS-REFERENCE TO RELATED APPLICATION

This application is based on and claims the benefit of priority to Korean Patent Application No. 10-2016-0094988, filed on Jul. 26, 2016 in the Korean Intellectual Property Office, the disclosure of which is incorporated herein in its entirety by reference.

TECHNICAL FIELD

The present invention relates to a graphite component and a manufacturing method thereof. In particular, the graphite component may comprise a graphite layer on a curved metal substrate.

BACKGROUND

In accordance with the recent trend of lightness and slimness, multi-functionalization, and high integration of an electronic device, it is required to solve a heat release problem due to an increase in heat density. In addition, heat release is important since it is closely related to reliability and lifespan of a device. Accordingly, various heat radiation materials have been developed, and have been commercially available in forms of a heat radiation pad, a heat radiation sheet, a heat radiation paint, and the like, to assist in or replace for the existing heat radiation apparatuses such as a heat radiation fan, a heat radiation fin, a heat pipe, and the like.

Among them, the heat radiation sheet has been manufactured in forms such as a graphite sheet, a polymer-ceramic composition sheet, a multilayer coated metal thin film sheet, and the like. For instance, the graphite sheet has been advantageously used between substrates configuring electronic circuits, and a plasma display panel (PDP) configuring a plasma television, and the like, since it is lightweight and slim, and has significantly higher thermal conductivity over copper.

However, the graphite sheet has excellent thermal conductivity in a transverse direction (horizontal direction), but thermal conductivity in a longitudinal direction (vertical direction) may not be sufficient.

In particular, the thermal conductivity of the graphite sheet in the transverse direction is about 1,500 kw/m$^2$, which is greater than metals such as copper and aluminum. However, the thermal conductivity of the graphite sheet in the longitudinal direction is about 5 to 10 kw/m$^2$, which is less than that of the graphite sheet in the transverse direction.

Accordingly, when the graphite sheet is used to disperse heat generated in the electronic device, it needs to attach a large area of graphite sheet in order to utilize a heat transfer property of the graphite sheet in the transverse direction, as illustrated in FIG. 1.

When there are a number of limitations in thickness, and relatively small limitation in area, for example, a smart phone, it is possible to use the large area of graphite sheet. However, when there is limitation in area of a component, for example, a vehicle component, it is difficult to apply the large area of graphite sheet for heat radiation of the component.

In order to utilize an excellent heat transfer property in the transverse direction so as to solve the above-described problem, there is a method of reducing the area of the graphite sheet by bending the graphite sheet. However, when bending the graphite sheet, crack occurs in an inside or an outside of the graphite, such that a heat transfer path may be disconnected, and the heat transfer property may be rapidly reduced. Further, even at the time of adding a soft material or an additive to the graphite to provide a soft property to the graphite, there is a problem in that heat transfer performance of a pure graphite material is deteriorated.

Therefore, it is required to develop a graphite component capable of effectively solving a heat generation problem caused in the electronic device without causing crack in the inside or the outside of the graphite.

SUMMARY

In preferred aspects, the present invention provides a graphite component capable of improving performance and lifespan characteristic of an electronic device by minimizing a heat generation problem caused in the electronic device without causing crack in an inside or an outside of the graphite.

Further provided is a manufacturing method of the graphite component. Still further provided is an electronic device including the component.

According to an exemplary embodiment of the present invention, a component may comprise: a metal substrate; and a graphite layer formed on the metal substrate, wherein the metal substrate may have one and more straight portions and one and more bent portions or curved portions. Preferably, the one or more straight portions and the one or more bent portions together may form a zigzag shape. In addition, each bent portion may have a round shape, and a number of bent portions may be two or greater.

Unless otherwise indicated herein, the term "graphite component" or "graphite structure" refers to a component comprising the metal substrate and the graphite layer formed thereon.

The term "bent portion" as used herein refers to a part that is formed in non-straight or non-linear shape and may include, at least in part, in a V-shape, U-shape, L-shape, C-shape or channel shape along a straight axis but the shapes thereof are not particularly thereto. Preferred bent portion may be curved to form a round shape, which may not include a sharp angle at any point of curvature.

The term "zigzag shape" as used herein refers to a pattern that includes a path between two parallel lines; without limitations to intervals. Preferred zigzag shape may be constituted of one or more straight portions and one or more bent portions to form paths between two parallel lines and the bent portions may positioned at the parallel lines changing directions.

Preferably, the graphite layer may have a thickness of about 1 μm to 25 mm. In addition, the metal substrate may have a thickness of about 1 μm to 10 mm.

Preferably, a thermal diffusivity of the graphite layer in a longitudinal direction may be of about 5 to 300 kw/m2, and a thermal diffusivity of the graphite layer in a transverse direction may be of about 1200 to 1800 kw/m$^2$.

The term "thermal diffusivity" as used herein refers to a property of heat conducting or thermal conductivity per density of a material, and may be measured by an amount of heat transferred from a hot side to a cold side. The thermal diffusivity of the material may also indicate even or uneven heat conduction of the material, for example, how quickly the material reacts to a change in temperature.

A number of the straight portions of the metal substrate may be one greater than the number of the bent portions, and the straight portions may have a predetermined length.

Preferably, the metal substrate may have a length from the bent portion to an end of the straight portion of about 5 mm to 200 mm. The metal substrate having the zigzag shape suitably may have a total length of about 10 mm to 72 mm.

Preferably, the graphite layer may comprise a polyimide layer.

According to another exemplary embodiment of the present invention, a manufacturing method of a graphite component may comprise: (S1) forming a polyamic acid coating layer on a metal substrate by coating and drying a polyamic acid coating solution on the metal substrate; (S2) forming a polyimide layer on the metal substrate by imidizing the polyamic acid coating layer; (S3) forming a graphite layer on the metal substrate by carbonizing the metal substrate in which the polyimide layer is formed; and (S4) rolling the metal substrate in which the graphite layer is formed. Preferably, the metal substrate may have one and more straight portions and one and more bent portions, each bent portion may have a round shape, and the number of bent portions is two or greater.

Preferably, the one or more straight portions and the one or more bent portions together may form a zigzag shape.

Preferably, a viscosity of the polyamic acid coating solution may have a range of about 3,000 cps to 15,000 cps measured by a Brookfield viscometer.

Preferably, the metal substrate after the polyamic acid coating solution may be coated is dried by rotating. The metal substrate may be rotated at a rotation speed of about 15 rpm to 60 rpm and a viscosity of the polyamic acid coating solution may be about 6,000 cps to 9,000 cps as measured by a Brookfield viscometer. The metal substrate suitably may be rotated at a temperature range of about 50° C. to 250° C.

The graphite component may be rolled by positioning rolling structures at each interspace of the graphite component, rolling the graphite structure with the rolling structures, and removing the rolling structures. The rolling structures may have a wedge shape, and may have the same shape as a shape of the interspace of the graphite component, within an error range of about 5%.

The error range may be an error range of an angle between a line passing through the center of each of the rolling structure and a line connected to the straight portion of the graphite component from a point extended from the line passing through the center of each of the rolling structure, with regard to an angle between a line passing through the center of the bent portion of the graphite component and a line connected to the straight portion of the graphite component from a point extended from the line passing through the center of the bent portion of the graphite component.

When the graphite component is rolled, a pressure may be applied in a slope of the graphite component at a range of about 5 Mpa to 20 Mpa as the rolling structures are inserted.

Preferably, the polyamic acid coating layer may have a thickness of about 10 µm to 7 mm.

Preferably, the graphite layer may be formed at a thickness of 1 µm to 25 mm.

Preferably, the polyamic acid coating layer may be imidized by curing at a temperature range of about 250° C. to 500° C.

The polyamic acid coating layer suitably may be carbonized at a temperature range of about 700° C. to 1100° C.

The polyamic acid coating solution may be prepared by polymerizing an aromatic diamine monomer and an aromatic dianhydride monomer in the presence of an organic solvent. The aromatic dianhydride suitably may comprise at least one monomer selected from the group consisting of pyromellitic dianhydride (PMDA), 3,3',4,4'-biphenyltetracarboxylic dianhydride (BPDA), 3,3',4,4'-benzophenonetetracarboxylic dianhydride, 4,4'-oxydiphthalic anhydride, 2,2'-bis-(3,4-dicarboxylphenyl)hexafluoropropane dianhydride, and 2,3,6,7-naphthalenetetracarboxylic dianhydride (NTCDA). The aromatic diamine suitably may comprise at least one monomer selected from the group consisting of p-phenylenediamine (p-PDA), 4,4'-oxydianiline (ODA), 3,3'-dimethylbenzidine, 1,4-naphthalenediamine, 1,5-naphthalenediamine, 4,4'-diaminobiphenyl-2,2'-bis(trifluoromethyl)benzidine (TFMB), 6-amino-2-(4-aminophenyl)benzoxazole, 5-amino-2-(4-aminophenyl)benzoxazole, m-phenylenediamine (m-PDA), 3'-methoxy-4,4'-diaminobenzanilide, diaminotoluene, 3,3'-dimethyl-4,4'-diaminodiphenylmethane, and diaminodiphenylsulfone. The organic solvent suitably may comprise at least one polar solvent selected from the group consisting of N,N'-dimethylacetamide (DMAc), N-methylpyrrolidone (NMP), tetrahydrofuran (THF), N,N'-dimethylformamide (DMF), dimethylsulfoxide (DMSO), cyclohexane, and acetonitrile.

Preferably, the coating may be performed by applying the polyamic acid coating solution using a die coater, a comma coater, a reverse comma coater, or a gravure coater.

In another exemplary embodiment of the present invention, further provided is an electronic device including the graphite component as described herein.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
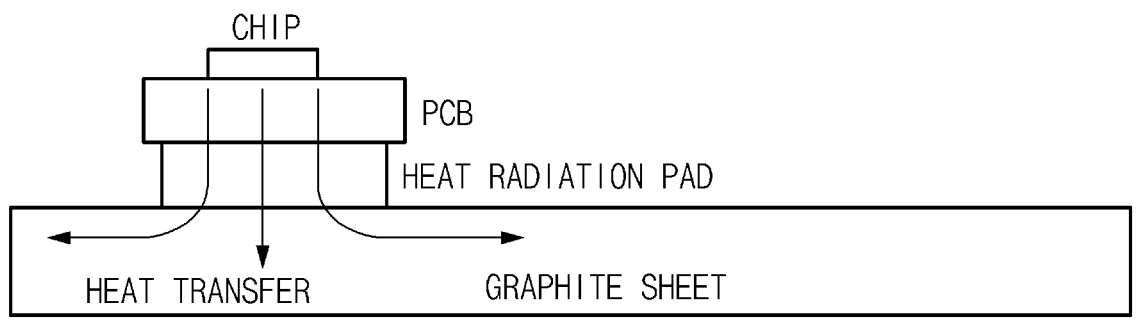
FIG. 1 illustrates an application example of a graphite sheet according to the related art.

Hereinafter, the present disclosure will be described in more detail to assist in understanding the technical idea of the present disclosure.

The terminology used herein is for the purpose of describing particular exemplary embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terms and words used in the present disclosure and claims should not be interpreted as being limited to typical meanings or dictionary definitions, but should be interpreted as having meanings and concepts relevant to the technical scope of the present disclosure based on the rule according to which an inventor can appropriately define the concept of the term to describe most appropriately the best method he or she knows for carrying out the disclosure.

A device or graphite structure of the present invention may include a metal substrate; and a graphite layer formed on the metal substrate. In particular, the metal substrate may include one or more straight portions and one or more bent portions (curved portions). Preferably, the one or more straight portions and the one or more bent portions together may form a zigzag shape. Further, each the bent portion may be bent to form a round shape, and the number of bent portions may be two or greater.

The graphite component according to an exemplary embodiment of the present disclosure is provided to solve the problems according to the related art. The curved metal substrate, i.e., the zigzag shaped metal substrate including at least two bent portions having a round shape (hereinafter, referred to as a curved part), may be used, and the graphite layer may be formed on the metal substrate, such that a large surface area may be implemented in confined space without any damage such as cracks in an inside or an outside of the graphite, and the like, and a heat radiation effect may be maximized, thereby solving a heat generation problem of an electronic device. Further, it is possible to secure stable performance and to more improve lifespan characteristic of the electronic device.

Hereinafter, the graphite component of the present invention, and a manufacturing method thereof are described in detail.

Figure 2A:
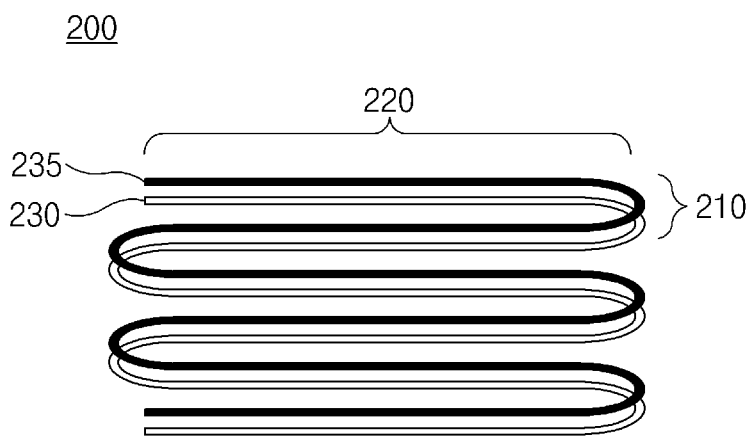
FIG. 2A illustrates an exemplary graphite component according to an exemplary embodiment of the present invention.
Figure 2B:
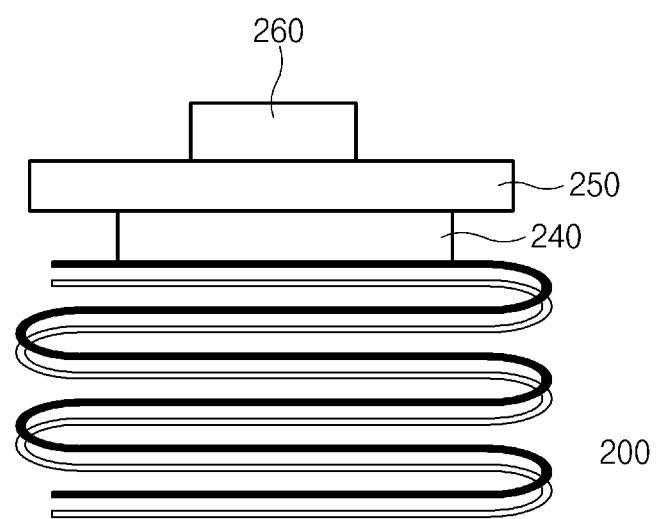
FIG. 2B illustrate an exemplary application example an exemplary graphite component according to an exemplary embodiment of the present invention.

FIG. 2A illustrates an exemplary graphite component according to an exemplary embodiment of the present invention and FIG. 2B illustrate an exemplary application example thereof Upon specifically reviewing the graphite component with reference to FIGS. 2A and 2B, the graphite component 200 according to an exemplary embodiment of the present disclosure may include a metal substrate 235, and a graphite layer 230 formed on one surface or both surfaces of the metal substrate 235, wherein the metal substrate has one or more straight portions 220 and one or more bent portions 210 forming the zigzag shape, each bent portion 210 has a round shape (hereinafter, referred to as the curved part), and the number of bent portions is two or more.

Further, FIG. 2B illustrates an application example of the component 200, which illustrates an application example of an electronic device including a heat source 260, a printed circuit board (PCB) 250, a heat radiation pad 240, and the graphite component 200 of the present disclosure.

In the graphite component according to an exemplary embodiment of the present invention, the number of bent portions 210 may be preferably 2 to 60, and more preferably, 3 to 25, and may be varied depending on application usage.

According to an exemplary embodiment of the present disclosure, it may be preferred that the number of straight portions 220 of the metal substrate is one greater than the number of bent portions 210, and the respective straight portions 220 have the same length as each other, as illustrated in FIG. 2A.

Specifically, a length of the metal substrate may vary depending on an electronic device to be applied, but for example, a length from the bent portion 210 to an end of the straight portion 220 may be 5 mm to 200 mm, and preferably, 6 mm to 120 mm.

In addition, the metal substrate having a zigzag shape may have a total length of 10 mm to 72 mm, and preferably, 18 mm to 30 mm.

According to an exemplary embodiment of the present disclosure, in the MIT flex test, flexural strength may be measured at a test load of 100 gf (0.98N), and a speed of 90 times/min by using an MIT fatigue test type D manufactured by Toyo Seiki Co., Ltd.

A thickness of the metal substrate, and more specifically, a thickness of the straight portion and a thickness of the bent portion may be various depending on the electronic device to be applied, but preferably, the thickness may be uniform, for example, 1 μm to 10 mm, and preferably, 5 μm to 2 mm.

Within the above-described thickness range, sufficient rigidity may be provided to the graphite layer.

If the thickness of the metal substrate of the straight portion and the bent portion is non-uniform, it may be difficult to uniformly form the graphite layer on the metal substrate. In addition, when the thickness of the metal substrate is more than the above-described thickness range, it may rather interfere with the heat radiation effect due to the metal substrate having an excessively thick thickness. In addition, when the thickness is thinner than the above-described range, sufficient rigidity may not be provided to the graphite layer, and thus, desirable shapes of the graphite layer may not be maintained.

The metal substrate is a structure made of a metallic material, and may include, for example, a metal selected from the group consisting of aluminum (Al), iron (Fe), silver (Ag), palladium (Pd), nickel (Ni), chromium (Cr), molybdenum (Mo), tungsten (W), stainless steel, and alloys thereof In addition, the graphite layer formed on the metal substrate is formed by including a polyimide layer as a raw material, and specifically, may be obtained by forming the polyimide layer on the metal substrate, followed by carbonization.

The thickness of the graphite layer may be 1 μm to 25 mm, preferably, 2 μm to 10 mm, and more preferably, 10 μm to 4 mm.

When the thickness of the graphite layer is more than the above-described range, sufficient rolling of the graphite layer may not be achieved, and when the thickness of the graphite layer is less than the above-described range, heat transfer performance of the graphite may be deteriorated due to excessively thin thickness of the graphite layer.

In the graphite component according to an exemplary embodiment of the present disclosure, a thermal diffusivity of the graphite layer in a longitudinal direction may be 5 to 300 kw/m$^2$, and a thermal diffusivity of the graphite layer in a transverse direction may be 1200 to 1800 kw/m$^2$.

In the graphite component according to an exemplary embodiment of the present disclosure, the thermal diffusivity of the graphite layer in the longitudinal direction may be measured on a graphite film sample cut into a size of 4×40 mm at an atmosphere of 23° C. and 10 Hz by using a thermal diffusivity measurement apparatus [LaserPit] manufactured by Ulvac Riko, Inc., according to a light exchange method.

The graphite component having the thermal diffusivity of the graphite layer in the longitudinal direction and the transverse direction may satisfy the above-described range, thereby further improving the heat radiation property of the electronic device, and thus, lifespan characteristic and performance of the electronic device may be remarkably improved.

Meanwhile, the present disclosure may provide the manufacturing method of a graphite component.

The manufacturing method of a graphite component according to an exemplary embodiment of the present disclosure may include: (S1) forming a polyamic acid coating layer on a metal substrate by coating and drying a polyamic acid coating solution on the metal substrate; (S2) forming a polyimide layer on the metal substrate by imidizing the polyamic acid coating layer; (S3) forming a graphite layer on the metal substrate by carbonizing the structure in which the polyimide layer is formed; and (S4) rolling the structure in which the graphite layer is formed, wherein the metal substrate has straight portions and bent portions (curved portions) forming a zigzag shape, each bent portion has a round shape, and the number of bent portions is two or more.

According to the manufacturing method of the graphite component according to an exemplary embodiment of the present disclosure, the polyamic acid coating layer may be formed on the curved metal substrate, followed by imidization, to form the polyimide layer, and then, the graphite layer may be formed by the carbonization, and thus, cracks may not occur in the inside or the outside of the graphite, which may form the graphite layer having a uniform thickness and may remarkably improve thermal conductivity, as compared to the existing method having a problem in that cracks occur in the inside or the outside of the graphite by bending the graphite sheet to reduce an area of the graphite sheet in order to utilize an excellent heat transfer property in the transverse direction.

In addition, as compared to the existing technology having an improved soft property by adding a soft material or an additive to the graphite to provide the soft property to the graphite, but having a problem in that heat transfer performance of a pure graphite material is deteriorated, the present disclosure may provide coating the polyamic acid coating solution on a curved metallic material substrate, such that the heat radiation property and lifespan characteristic of the electronic device may be improved while solving the above-described problem.

The manufacturing method of the graphite component according to an exemplary embodiment of the present disclosure is specifically described as follows step by step.

First, in the manufacturing method of the graphite component, the step S1 is to form the polyamic acid coating layer on the metal substrate by coating and drying the polyamic acid coating solution on the metal substrate.

In the step S1, the metal substrate may have the straight portions and bent portions (curved portions) forming a zigzag shape, each bent portion has a round shape, and the number of bent portions is two or more.

The metal substrate is a structure made of a metallic material and not melted at a high temperature of the carbonization process of step S3, and may include, for example, a metal selected from the group consisting of aluminum (Al), iron (Fe), silver (Ag), palladium (Pd), nickel (Ni), chromium (Cr), molybdenum (Mo), tungsten (W), stainless steel, and alloys thereof, and in particular, may preferably include tungsten (W). The metal substrate made of the tungsten material may be prepared into the curved structure having a zigzag shape in advance before being used.

According to an exemplary embodiment of the present disclosure, the polyamic acid coating solution coated on the metal substrate may be any polyamic acid coating solution capable of generally forming polyimide.

According to an exemplary embodiment of the present invention, the polyamic acid coating solution may be prepared by condensation polymerizing an aromatic dianhydride and an aromatic diamine in the presence of an organic solvent.

The aromatic dianhydride may include at least one monomer selected from the group consisting of pyromellitic dianhydride (PMDA), 3,3',4,4'-biphenyltetracarboxylic dianhydride (BPDA), 3,3',4,4'-benzophenonetetracarboxylic dianhydride, 4,4'-oxydiphthalic anhydride, 2,2'-bis-(3,4-dicarboxylphenyl)hexafluoropropane dianhydride, and 2,3,6,7-naphthalenetetracarboxylic dianhydride (NTCDA).

The aromatic diamine may include at least one monomer selected from the group consisting of p-phenylenediamine (p-PDA), 4,4'-oxydianiline (ODA), 3,3'-dimethylbenzidine, 1,4-naphthalenediamine, 1,5-naphthalenediamine, 4,4'-diaminobiphenyl-2,2'-bis(trifluoromethyl)benzidine (TFMB), 6-amino-2-(4-aminophenyl)benzoxazole, 5-amino-2-(4-aminophenyl)benzoxazole, m-phenylenediamine (m-PDA), 3'-methoxy-4,4'-diaminobenzanilide, diaminotoluene, 3,3'-dimethyl-4,4'-diaminodiphenylmethane, and diaminodiphenylsulfone.

The organic solvent may include at least one polar solvent selected from the group consisting of N,N'-dimethylacetamide (DMAc), N-methylpyrrolidone (NMP), tetrahydrofuran (THF), N,N'-dimethylformamide (DMF), dimethylsulfoxide (DMSO), cyclohexane, and acetonitrile, but is not limited thereto.

Preferably, the organic solvent may be used as much as it is able to uniformly dissolve each component, and to satisfy an appropriate viscosity range of the polyamic acid coating solution for effects of the present invention. For example, a solute content (solid content) to the solvent suitably may range from about 10 wt % to about 20 wt %. When the solid content is less than about 10 wt %, the use of solvent may be unnecessarily increased, and when the solid content is greater than about 20 wt %, it is not possible to perform uniform coating due to an excessively increased viscosity of a solution.

The condensation polymerization reaction may be preferably performed in a nitrogen atmosphere, and may be performed at room temperature or may be performed by increasing a temperature as needed in order to accelerate a reaction speed.

According to an exemplary embodiment of the present invention, the aromatic dianhydride and the aromatic diamine may be preferably polymerized, for example, at a molar ratio of about 1:0.95 to about 1:1.05, and when the molar ratio is out of the above-described molar ratio, the viscosity may be reduced after the polymerization, which makes postprocessing difficult.

The polyamic acid coating solution for forming the polyimide layer in the present invention may contain a small amount of other aromatic diamines or aromatic dianhydrides except for the components. In addition, in order to facilitate coating or curing of the polyamic acid coating solution or to improve other physical properties, an additive such as an anti-foaming agent, a gel prevention agent, a curing accelerator, or the like, may be further added.

According to an exemplary embodiment of the present invention, it is more important to uniformly apply the polyamic acid coating solution on the curved metal substrate. In order to coat the curved metal substrate having a zigzag shape with a uniform thickness, the polyamic acid coating solution may preferably have an appropriate viscosity, for example, a viscosity of the polyamic acid coating solution may preferably have a range of about 3,000 cps to 15,000 cps, or particularly, of about 6,000 cps to 9,000 cps measured by a Brookfield viscometer.

By applying the polyamic acid coating solution having the above-described viscosity on the curved metal substrate, the graphite layer formed by the imidization process and the carbonization process of polyimide may be uniformly formed, and thus, uniform heat transfer property may be achieved.

Further, when the thickness of the graphite layer is non-uniform in the rolling process after the graphite layer is formed on the metal substrate, the graphite layer may not be rolled uniformly, such that a rolling degree of the graphite may be different. In addition, the heat transfer property of the graphite in which the rolling is not sufficiently performed may be partially deteriorated. As a result, a heat transfer bottleneck phenomenon may occur in parts in which the heat transfer property is deteriorated, and thus, an overall heat transfer performance of the graphite may be deteriorated.

When the viscosity of the polyamic acid coating solution is less than about 3,000 cps, the thickness after the rolling may be substantially reduced, which may deteriorate the heat transfer performance. When the viscosity of the polyamic acid coating solution is greater than about 15,000 cps, flowability of the polyamic acid may not be sufficient, such that the polyamic acid may remain in the curved portions, and thus, in the rolling process after the carbonization process, it is difficult to sufficiently roll the graphite, which may deteriorate the heat transfer property.

The coating process in which the polyamic acid coating solution is uniformly applied on the metal substrate may be performed by coating methods known in the art, and for example, may be performed by using a die coater, a comma coater, a reverse comma coater, a gravure coater, and the like.

The drying process may vary depending on a structure or condition of an oven, but may be generally performed at a temperature less than a boiling point of a solvent, i.e., of about 50° C. to 250° C., and or particularly, of about 80° C. to 150° C. for about 3 to 60 minutes.

In addition, after the solvent is dried, the polyamic acid coating solution may not flow, and thus, in order to form a uniform polyamic acid coating film on the structure, or in order to prevent excessively thick coating, the metal substrate with which the polyamic acid is coated suitably may be rotated at the time of drying the solvent of the polyamic acid.

In rotating the structure, the number of revolutions per minute may be added or subtracted depending on a viscosity of the polyamic acid coating layer. The rotation suitably may be performed at a rotation speed of about 15 rpm to 60 rpm at a range in which the viscosity of the polyamic acid coating layer may be of about 6,000 cps to 9,000 cps measured by a Brookfield viscometer.

When the rotation speed of the structure is greater than about 60 rpm, the polyamic acid remains and agglomerates in the curved portions of the curved structure, such that the solvent may not be dried sufficiently, and a thickness of the final polyimide layer may be increased. In addition, in the rolling process after the carbonization process, the graphite layer which is the carbonized polyimide layer may not be sufficiently rolled. In addition, when the rotation speed of the structure is less than about 15 rpm, the polyamic acid coating layer coated on the structure may be excessively fallen, such that the polyamic acid coating layer may be thin, and the thickness of the final graphite layer may be decreased, which may deteriorate the heat transfer performance of the graphite.

The rotation suitably may be performed at a temperature range of about 50° C. to 250° C. for about 3 minutes to 60 minutes.

A coating thickness of the polyamic acid coating solution suitably may be 10 μm to 7 mm, or particularly of about 50 μm to 4 mm.

When the coating is performed with the above-described range of thickness, an optimum graphite layer may be obtained, thereby achieving excellent thermal conductivity and mechanical physical properties.

When the coating thickness of the polyamic acid coating solution is less than the above-described range, the thickness of the graphite layer after the imidization and the carbonization may be substantially reduced due to an extremely small amount of coating thickness, such that thermal conductivity may be reduced, and performance of the electronic device may be deteriorated. In addition, when the coating thickness of the polyamic acid coating solution is greater than the above-described range, the coating may be non-uniform, and the excessive thickness may cause problems during processes, and have adverse effects on performance of the electronic device.

In the manufacturing method of the component according to an exemplary embodiment of the present invention, the step S2 is a step of forming a polyimide layer on the metal substrate by imidizing the polyamic acid coating layer.

The imidization reaction may be performed by methods generally used in the art. For example, the polyimide layer may be formed by imidizing the polyamic acid coating layer coated on the metal substrate in step S1 above.

In addition, according to an exemplary embodiment of the present invention, the imidization may be performed by a curing process. The curing process may be performed at a temperature range of about 250° C. to 500° C., or particularly, of about 300° C. to 450° C., for about 5 minutes to 2 hours, and or particularly, of about 30 minutes to 1 hour and 30 minutes. In addition, the curing step suitably may be performed in a nitrogen atmosphere, and for example, in a nitrogen oven.

In the manufacturing method of the component according to an exemplary embodiment of the present invention, the step S3 is a step of forming a graphite layer on the metal substrate by carbonizing the polyimide layer.

The process for carbonizing the polyimide layer obtained from step S2 above may form the graphite layer through the carbonization process according to methods generally used in the art.

In particular, the carbonization may be performed by heat treating the structure in which the polyimide layer is formed in the nitrogen atmosphere. The carbonization may be performed, for example, in a nitrogen oven at a temperature range of about 700° C. to 1100° C. for about 3 to 7 hours.

In the manufacturing method of the component according to an exemplary embodiment of the present invention, the step S4 is a step of rolling the structure in which the graphite layer is formed.

When the graphite layer which is the carbonized polyimide obtained from step S3 above is subjected to the rolling process, the graphite layer may have excellent heat transfer property. A general artificial graphite may be rolled by using a rolling roller since it has a plate shape, but the graphite having a curved shape rather than the plate shape like the present invention is not able to be rolled by using the rolling roller.

Preferably, rolling may be performed by using a particularly designed rolling structure. In order to improve the heat transfer property of the graphite, the rolling structures each having the same shape as a shape of the metal substrate in which the graphite layer is formed may be inserted at each interspace of the structure in which the graphite layer is formed, and then, the rolling may be performed. Preferably, the rolling structures may be made of metallic materials.

Figure 3A:
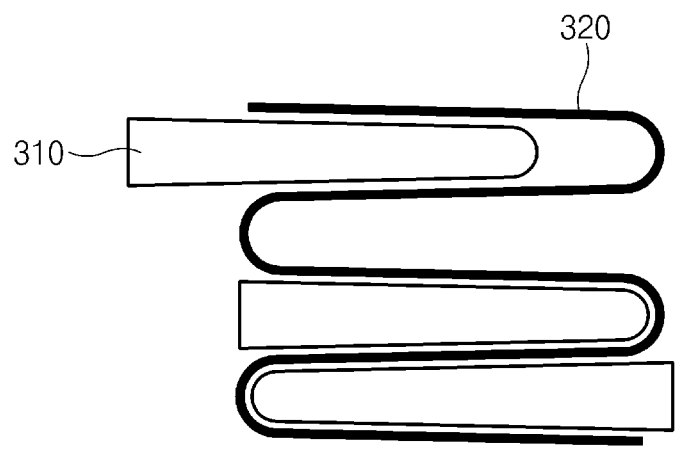
FIG. 3A illustrates an exemplary rolling process of positioning and inserting exemplary rolling structures in an exemplary graphite component according to an exemplary embodiment of the present invention.
Figure 3B:
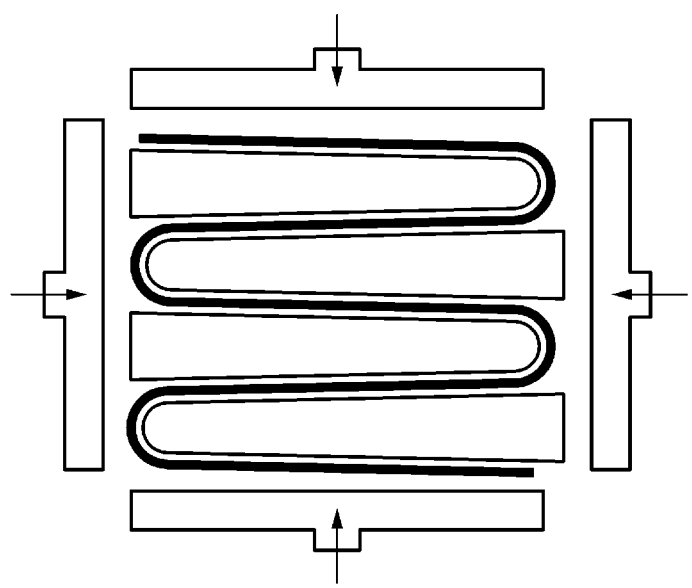
FIG. 3B illustrates an exemplary rolling process of applying pressure to an exemplary graphite component according to an exemplary embodiment of the present invention.
Figure 4:
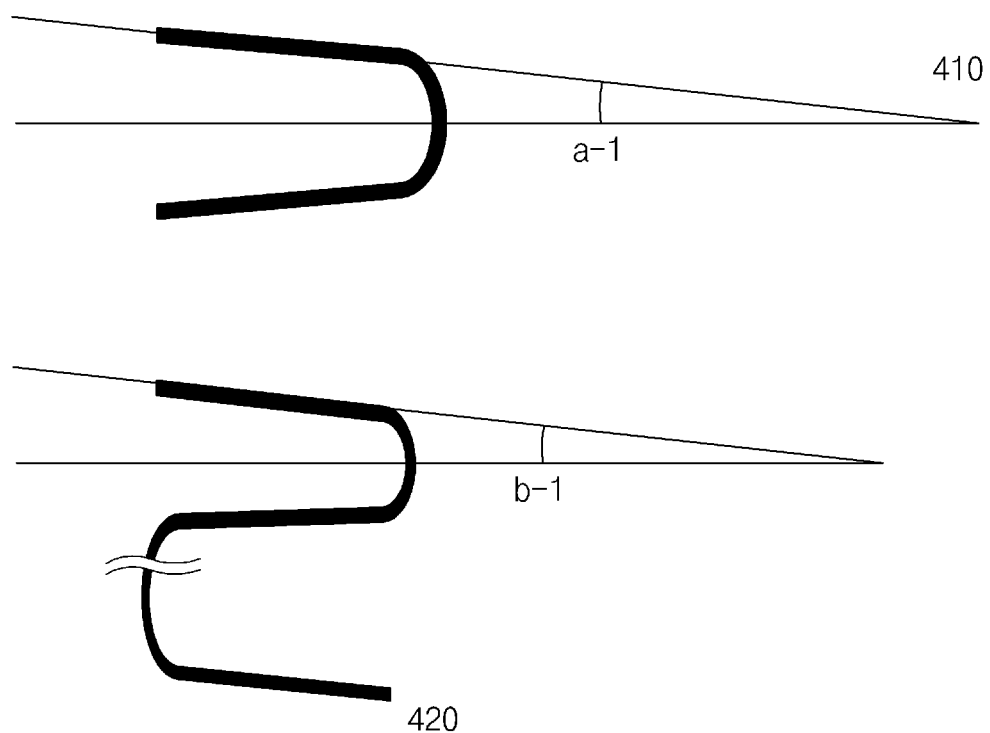
FIG. 4 illustrates an exemplary rolling structure for rolling used in the rolling process, and an error range with regard to an angle of the graphite component, in the manufacturing method of the graphite component according to an exemplary embodiment of the present disclosure.

According to an exemplary embodiment of the present invention, in order to prevent damage of the graphite layer when inserting the rolling structures at the time of the rolling process, it is required for the metal substrate in which the graphite layer is formed and the rolling structures to have the wedge shape as illustrated in FIGS. 3A, 3B and 4.

The exemplary rolling process is specifically illustrated in FIGS. 3A, 3B and 4.

First, upon specifically considering the rolling step with reference to FIGS. 3A and 3B according to an exemplary embodiment of the present invention, the rolling structures 310 may be positioned at each interspace of the component 320 (FIG. 3A), and the component may be rolled in a slope in a state in which the rolling structures are inserted (FIG. 3B). Further, after the rolling, the rolling structures may be removed.

The rolling structures 310 may have a wedge shape, and have the same shape as a shape of the interspace of the component, within an error range of about 5%.

In particular, as illustrated in FIG. 4, the error range may be an error range of an angle (hereinafter, referred to as a wedge angle, a-1) between a line passing through the center of each of the rolling structure 410 and a line connected to the straight portion of the structure from a point extended from the line passing through the center of each of the rolling structure, with regard to an angle (b-1) between a line passing through the center of the bent portion (curved portion) of the component and a line connected to the straight portion of the structure from a point extended from the line passing through the center of the bent portion (curved portion) of the component, and the error range may be of about 5% or less.

According to an exemplary embodiment of the present invention, when the error range of the wedge angle (a-1) as compared to the angle (b-1) of the structure in which the graphite layer is formed is greater than about 5%, the graphite layer of the bent portion may not be sufficiently rolled, and thus, overall heat transfer performance of the component may be deteriorated.

According to an exemplary embodiment of the present invention, the rolling may be performed by applying pressure in a slope of the component at a range of about 5 Mpa to 20 Mpa in a state in which the rolling structures are inserted.

After the rolling, the graphite layer formed on the metal substrate may have a thickness of about 1 μm to 25 mm, of about 2 μm to 10 mm, or particularly of about, 10 μm to 4 mm.

When the graphite layer is formed in the above-described range, a maximum thermal conductivity effect may be obtained and a heat radiation effect may be maximized.

According to an exemplary embodiment of the present invention, provided is a component manufactured by the manufacturing method.

In addition, according to an exemplary embodiment of the present invention, provided is an electronic device including the component.

Accordingly, the component according to an exemplary embodiment of the present invention may have substantially improved thermal conductivity in the longitudinal direction as well as the transverse direction, which may be suitable for applications requiring the above-described characteristics.

Hereinafter, Examples will be provided in detail to describe the present invention. However, the following Examples according to the present invention may be modified into various embodiments, and should not be interpreted as limiting the scope of the present invention. These Examples of the present invention are provided so that those skilled in the art may more thoroughly understand the present invention.

EXAMPLE

<Preparation of Polyamic Acid Coating Solution>

Preparation Example 1

An 1 L reactor was dried in an oven at a temperature of 100° C. for 30 minutes to dry moisture, and was under a nitrogen purge to prevent inflow of moisture. Then, an amount of 700 g of dimethylformamide (DMF) containing 100 ppm or less moisture was added to the reactor.

A temperature in the reactor containing the solvent was maintained at a temperature of 60° C., and 4,4'-oxydianiline (ODA) was added and stiffed at a speed of 1,000 rpm until the solvent was completely dissolved.

After that, pyromellitic dianhydride (PMDA) divided into five portions was added, and a viscosity was controlled by controlling an amount of the fifth raw material. When the viscosity of the reaction solution was 7,500 cps, the addition of the PMDA was terminated, and the reaction solution was stiffed for 30 minutes while maintaining the temperature of the reactor to complete the reaction, thereby obtaining a polyamic acid coating solution.

Preparation Example 2

A polyamic acid coating solution was obtained by performing the same method as the Preparation Example 1 above except that when the viscosity of the reaction solution was 1,500 cps, the addition of the PMDA was terminated, and the reaction solution was stirred for 30 minutes while maintaining the temperature of the reactor to complete the reaction.

Preparation Example 3

A polyamic acid coating solution was obtained by performing the same method as the Preparation Example 1 above except that when the viscosity of the reaction solution was 21,000 cps, the addition of the PMDA was terminated, and the reaction solution was stirred for 30 minutes while maintaining the temperature of the reactor to complete the reaction.

Example 1

<Step (S1): Step of Forming a Polyamic Acid Coating Layer on a Metal Substrate by Coating and Drying a Polyamic Acid Coating Solution on the Metal Substrate>

A polyamic acid coating solution of which a viscosity was 7,500 cps obtained by Preparation Example 1 was degassed for 10 minutes. A zigzag shaped tungsten structure including curved portions (a thickness of 22 μm, a total length of 150 mm, and 12 curved portions) manufactured in advance was immersed in the degassed coating solution for 1 minute, and then the structure was separated from the polyamic acid coating solution.

The DMF solvent was dried while fixing the structure to a separate rotation jig and rotating the structure in an oven at a temperature 120° C. at a speed of 45 rpm for 10 minutes, thereby forming a polyamic acid coating layer on the tungsten structure. Here, the polyamic acid coating layer had a thickness of 85 μm.

<Step (S2): Step of Forming a Polyimide Layer on the Metal Substrate by Imidizing the Polyamic Acid Coating Layer>

The structure in which the polyamic acid coating layer was formed on the tungsten structure which was obtained by step S1 above, was cured in a nitrogen oven at a temperature of 370° C. for 1 hour to perform imidization, thereby forming a polyimide layer on the tungsten structure.

<Step (S3): Step of Forming a Graphite Layer on the Metal Substrate by Carbonizing the Structure in which the Polyimide Layer is Formed>

The structure in which the polyimide layer was formed on the tungsten structure which was obtained by step S2 above, was left in a nitrogen oven at a temperature of 1,000° C. for 4 hours to perform carbonization, thereby forming a graphite layer on the tungsten structure.

<Step (S4): Step of Rolling the Structure in which the Graphite Layer is Formed>

Metallic structures for rolling each having a wedge shape and having the same shape as a shape of the structure in which the graphite layer was formed on the tungsten structure which was obtained by step S3 above were inserted at each interspace of the structure in which the graphite layer was formed. Then, the structure was subjected to press-rolling by applying pressure of 10 Mpa in a slope for 20 minutes. In the rolling process, an error in an angle of the wedge shaped structure for rolling and the graphite component was 3%.

After the rolling process, the metallic structures for rolling were removed, and the graphite component including the graphite layer of which a finally rolled thickness was 16 μm was manufactured.

Example 2

A graphite component was manufactured by performing the same process as Example 1 above except that the rotation speed was 40 rpm when the structure immersed in the polyamic acid coating solution was fixed to the jig in step S1 of Example 1 above.

Example 3

A graphite component was manufactured by performing the same process as Example 1 above except that the error of the wedge angle of the wedge shaped structure for rolling with regard to the angle of the graphite component was 1% in step S4 of Example 1 above.

Example 4

A graphite component was manufactured by performing the same process as Example 1 above except that the error of the wedge angle of the wedge shaped structure for rolling with regard to the angle of the graphite component was 5% in step S4 of Example 1 above.

Example 5

A graphite component was manufactured by performing the same process as Example 1 above except that the polyamic acid coating solution having a viscosity of 1,500 cps obtained by Preparation Example 2 was used in step S1 of Example 1 above.

Example 6

A graphite component was manufactured by performing the same process as Example 1 above except that the polyamic acid coating solution having a viscosity of 21,000 cps obtained by Preparation Example 3 was used in step S1 of Example 1 above.

Example 7

A graphite component was manufactured by performing the same process as Example 1 above except that the rotation speed was 5 rpm when the structure immersed in the polyamic acid coating solution was fixed to the jig in step S1 of Example 1 above.

Example 8

A graphite component was manufactured by performing the same process as Example 1 above except that the rotation speed was 75 rpm when the structure immersed in the polyamic acid coating solution was fixed to the jig in step S1 of Example 1 above.

Example 9

A graphite component was manufactured by performing the same process as Example 1 above except that the error of the wedge angle of the wedge shaped structure for rolling with regard to the angle of the graphite component was 7% in step S4 of Example 1 above.

Comparative Example 1

A graphite component was manufactured by performing the same process as Example 1 above except for using a straight typed tungsten substrate having a thickness of 22 μm rather than using the zigzag shaped and curved tungsten structure in step S1 of Example 1 above.

Comparative Example 2

A graphite component was manufactured by performing the same process as Example 1 above except for coating a polyethylene terephthalate (PET) coating solution with a thickness of about 2 mm rather than using the polyamic acid coating solution of Example 1.

Experimental Example 1

Thickness Uniformity of Graphite Layer

A thickness uniformity of the graphite layer was determined by analyzing cross sections of 10 samples including the straight portions and the bent portions (curved portions) to measure each thickness of the finally rolled graphite layers, calculating an average of the measured thicknesses, and calculating a standard deviation.

Experimental Example 2

Heat Radiation Performance

<Measurement of Maximum Temperature of Graphite Component>

A heat radiation performance of the graphite component was confirmed by attaching a ceramic heater of a temperature of 100° C. below the final graphite component, and after 30 minutes, measuring the maximum temperature of a top central portion of the graphite component. When a heat transfer performance was excellent, a temperature of the top was higher.

<Measurement of Component Temperature of Electronic Device>

A component temperature was confirmed by attaching the graphite component below an electronic component having a heat generation function, and then measuring a temperature of an electronic device that generated heat after 30 minutes. When a heat transfer performance was excellent, a temperature of the component was lower.

the polyamic acid coating solution, the number of revolutions of the structure at the time of rolling, and the error range of the rolling structure.

Particularly, when the viscosity of the polyamic acid coating solution, the number of revolutions of the structure at the time of rolling, and the error range of the rolling structure were satisfied within the above-described specific range like Examples 1 to 4, Examples 1 to 4 had the thickness standard deviation between 0.09 to 0.21 to have excellent thickness uniformity.

Moreover, when comparing Example 1 with Example 6 having a different viscosity of the polyamic acid coating solution from that of Example 1, the thickness uniformity of the graphite layer of Example 1 had about over 10-fold difference from that of Example 6.

Further, when comparing Example 2 with Examples 7 and 8 having a different number of revolutions of the structure at the time of rolling from that of Example 2, the thickness uniformity of the graphite layer of Example 2 had about 20-fold difference from those of Examples 7 and 8.

Additionally, when comparing Examples 3 and 4 in which the error of the wedge angle of the wedge shaped structure for rolling with regard to the angle of the graphite component was 5% or less with Example 9 in which the error was 7%, the thickness uniformity of the graphite layers of Examples 3 and 4 had about 45 times from that of Example 9 having the error of 7%. Further, the thickness uniformity of Comparative Example 2 using the PET resin had a large difference from that of the graphite layers of Examples 3 and 4.

On the contrary, when comparing the graphite components of Examples 1 to 9 and Comparative Examples 1 and 2 in view of the heat radiation performance according to Experimental Example 2, the maximum temperature of the graphite components of Examples 1 to 9 of the present invention was respectively 58.1° C. to 86.7° C. as confirmed from Table 1 above. On the contrary, the maximum temperature of the graphite components of Comparative Examples 1 and 2 was respectively as low as 32.1° C. and 62.0° C.

In addition, as shown in Table 1, in the manufacturing process of the graphite components of Examples 1 to 9, the

TABLE 1

| Note | Example 1 | Example 2 | Example 3 | Example 4 | Example 5 | Example 6 | Example 7 | Example 8 | Example 9 | Comparative Example 1 | Comparative Example 2 |
|---|---|---|---|---|---|---|---|---|---|---|---|
| Thickness uniformity of graphite layer | 0.12 | 0.09 | 0.10 | 0.21 | 0.09 | 1.75 | 1.83 | 2.43 | 4.75 | 0.3 | 3.65 |
| Maximum temperature (° C.) | 83.0 | 85.2 | 86.7 | 79.0 | 63.0 | 59.0 | 62.1 | 58.3 | 58.1 | 32.1 | 62.0 |
| Component temperature (° C.) | 109.0 | 108.1 | 106.1 | 110.3 | 120.0 | 121.0 | 123.3 | 124.3 | 123.9 | 151.2 | 152.3 |

Upon considering the thickness uniformity of the graphite of Examples 1 to 9 according to Experimental Example 1, all of Examples 1 to 9 of the present invention had 4.75 or less thickness uniformity.

In addition, as shown in Table 1, in the manufacturing process of the graphite components of Examples 1 to 9 and Comparative Examples 1 and 2, the thickness uniformity of the graphite layer could be controlled with the viscosity of maximum temperature of the graphite components could be controlled according to the viscosity of the polyamic acid coating solution, the number of revolutions of the structure at the time of rolling, and the error range of the rolling structure.

In particular, by controlling the viscosity of the polyamic acid coating solution in the components of Examples 1 to 9, the maximum temperature of the graphite components of Examples 1 to 4 was 79° C. to 86.7° C., but the maximum temperature of the graphite components of Examples 5 to 9 was 58.1° C. to 63° C.

Moreover, when comparing Example 1 with Example 6 having a different viscosity of the polyamic acid coating solution from that of Example 1, the maximum temperature of the graphite component of Example 1 was about 24° C. greater than that of the graphite component of Example 6.

Further, when comparing Example 2 with Examples 7 and 8 having a different number of revolutions of the structure at the time of rolling from that of Example 2, the maximum temperature of the graphite component of Example 2 was up to about 26° C. greater than those of the graphite components of Examples 7 and 8.

Further, when comparing Examples 3 and 4 in which the error of the wedge angle of the wedge shaped structure for rolling with regard to the angle of the graphite component was 5% or less with Example 9 in which the error was 7%, the maximum temperature of the graphite components of Examples 3 and 4 was up to about 28° C. greater than that of the graphite component of Example 9.

Accordingly, the heat transfer performance of the graphite components of Examples 1 to 4 was remarkably excellent as compared to Examples 5 to 9.

Meanwhile, when considering the temperature of the electronic component using the graphite components of Examples 1 to 9 according to Experimental Example 2, the temperature of the electronic components of Examples 1 to 9 was 106.1° C. to 124.3° C. On the contrary, the temperature of the electronic components of Comparative Examples 1 and 2 was increase to 151.2° C. and 152.3° C.

In particular, as shown in Table 1, in the manufacturing process of the graphite components of Examples 1 to 9, the temperature of the electronic component could be controlled according to the viscosity of the polyamic acid coating solution, the number of revolutions of the structure at the time of rolling, and the error range of the rolling structure.

In particular, as shown in Table 1, when comparing Examples 1 to 4 and Examples 5 to 9 in view of the temperature of the electronic component, the temperature of the electronic components of Examples 1 to 4 was 106.1° C. to 110.3° C., but the temperature of the electronic components of Examples 5 to 9 was 120° C. to 124.3° C.

In addition, when comparing Example 1 with Example 6 having a different viscosity of the polyamic acid coating solution from that of Example 1, the temperature of the electronic component of Example 1 was about 11° C. less than that of the electronic component of Example 6.

Further, when comparing Example 2 with Examples 7 and 8 having a different number of revolutions of the structure at the time of rolling from that of Example 2, the temperature of the electronic component of Example 2 was up to about 16° C. less than that of the electronic components of Examples 7 and 8.

Further, when comparing Examples 3 and 4 in which the error of the wedge angle of the wedge shaped structure for rolling with regard to the angle of the graphite component was 5% or less with Example 9 in which the error was 7%, the temperature of the electronic components of Examples 3 and 4 was up to about 13° C. less than that of the electronic component of Example 9.

Accordingly, the heat transfer performance of the graphite components of Examples 1 to 4 was remarkably excellent as compared to Examples 5 to 9, and Comparative Examples 1 and 2.

As described above, according to various exemplary embodiments of the present invention, the graphite component according to the present invention may solve the heat generation problem to improve the heat radiation effect, such that the lifespan characteristic and performance of the electronic device may be further improved.

In addition, according to the exemplary manufacturing method of the graphite component of the present invention, the thickness uniformity of the graphite layer may be effectively improved.

Hereinabove, although the present invention has been described with reference to exemplary embodiments and the accompanying drawings, the present invention is not limited thereto, but may be variously modified and altered by those skilled in the art to which the present invention pertains without departing from the spirit and scope of the present invention claimed in the following claims.

What is claimed is:

1. A method of manufacturing a graphite component comprising:
    forming a polyamic acid coating layer on a metal substrate by coating and drying a polyamic acid coating solution on the metal substrate;
    forming a polyimide layer on the metal substrate by imidizing the polyamic acid coating layer;
    forming a graphite layer on the metal substrate by carbonizing the metal substrate on which the polyimide layer is formed, thereby forming the graphite component; and
    rolling the graphite component,
    wherein the metal substrate comprises one or more straight portions and two or more bent portions, each bent portion has a round shape.

2. The method according to claim 1, wherein the one or more straight portions and the two or more bent portions together form a zigzag shape.

3. The method according to claim 1, wherein a viscosity of the polyamic acid coating solution has a range of about 3,000 cps to 15,000 cps measured by a Brookfield viscometer.

4. The method according to claim 1, wherein the metal substrate after the polyamic acid coating solution is coated is dried by rotating.

5. The method according to claim 4, wherein the metal substrate is rotated at a rotation speed of about 15 rpm to 60 rpm and a viscosity of the polyamic acid coating solution is about 6,000 cps to 9,000 cps as measured by a Brookfield viscometer.

6. The method according to claim 4, wherein the metal substrate is rotated at a temperature range of about 50° C. to 250° C.

7. The method according to claim 1, wherein the graphite component is rolled by positioning rolling structures at each interspace of the graphite component, rolling the graphite structure with the rolling structures, and removing the rolling structures.

8. The method according to claim 7, wherein the rolling structures have a wedge shape, and have the same shape as a shape of the interspace of the graphite component, within an error range of about 5%.

9. The method according to claim 8, wherein the error range is an error range of an angle between a line passing through the center of each of the rolling structures and a line connected to the straight portion of the structure from a point extended from the line passing through the center of each of the rolling structure, with regard to an angle between a line passing through the center of the bent portion of the graphite component and a line connected to the straight portion of the structure from a point extended from the line passing through the center of the bent portion of the graphite component.

10. The method according to claim 8, wherein when the graphite component is rolled, a pressure is applied in a slope of the graphite component at a range of about 5 Mpa to 20 Mpa as the rolling structures are inserted.

11. The method according to claim 1, wherein the polyamic acid coating layer has a thickness of about 10 μm to 7 mm.

12. The method according to claim 1, wherein the graphite layer is formed at a thickness of 1 μm to 25 mm.

13. The method according to claim 1, wherein the polyamic acid coating layer is imidized by curing at a temperature range of about 250° C. to 500° C.

14. The method according to claim 1, wherein the polyamic acid coating layer is carbonized at a temperature range of about 700° C. to 1100° C.

15. The method according to claim 1, wherein the polyamic acid coating solution is prepared by polymerizing an aromatic diamine monomer and an aromatic dianhydride monomer in the presence of an organic solvent.

16. The method according to claim 15, wherein the aromatic dianhydride comprises at least one monomer selected from the group consisting of pyromellitic dianhydride (PMDA), 3,3',4,4'-biphenyltetracarboxylic dianhydride (BPDA), 3,3',4,4'-benzophenonetetracarboxylic dianhydride, 4,4'-oxydiphthalic anhydride, 2,2'-bis-(3,4-dicarboxylphenyl)hexafluoropropane dianhydride, and 2,3,6,7-naphthalenetetracarboxylic dianhydride (NTCDA).

17. The method according to claim 15, wherein the aromatic diamine comprises at least one monomer selected from the group consisting of p-phenylenediamine (p-PDA), 4,4'-oxydianiline (ODA), 3,3'-dimethylbenzidine, 1,4-naphthalenediamine, 1,5-naphthalenediamine, 4,4'-diaminobiphenyl-2,2'-bis(trifluoromethyl)benzidine (TFMB), 6-amino-2-(4-aminophenyl)benzoxazole, 5-amino-2-(4-aminophenyl)benzoxazole, m-phenylenediamine (m-PDA), 3'-methoxy-4,4'-diaminobenzanilide, diaminotoluene, 3,3'-dimethyl-4,4'-diaminodiphenylmethane, and diaminodiphenylsulfone.

18. The method according to claim 15, wherein the organic solvent comprises at least one polar solvent selected from the group consisting of N,N'-dimethylacetamide (DMAc), N-methylpyrrolidone (NMP), tetrahydrofuran (THF), N,N'-dimethylformamide (DMF), dimethylsulfoxide (DMSO), cyclohexane, and acetonitrile.

19. The method according to claim 1, wherein the coating is performed by applying the polyamic acid coating solution using a die coater, a comma coater, a reverse comma coater, or a gravure coater.

* * * * *